US012709818B2

(12) United States Patent
Oya et al.

(10) Patent No.: US 12,709,818 B2
(45) Date of Patent: Aug. 18, 2026

(54) SILICON CARBIDE SINGLE CRYSTAL AND MANUFACTURING METHOD OF SILICON CARBIDE SINGLE CRYSTAL

(71) Applicants: DENSO CORPORATION, Kariya-city (JP); TOYOTA JIDOSHA KABUSHIKI KAISHA, Toyota (JP); MIRISE Technologies Corporation, Nisshin (JP)

(72) Inventors: Nobuyuki Oya, Nisshin (JP); Takeshi Okamoto, Nisshin (JP); Akiyoshi Horiai, Nisshin (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 279 days.

(21) Appl. No.: 18/435,218

(22) Filed: Feb. 7, 2024

(65) Prior Publication Data

US 2024/0337044 A1 Oct. 10, 2024

(30) Foreign Application Priority Data

Apr. 7, 2023 (JP) ................................ 2023-062933

(51) Int. Cl.
*C30B 29/36* (2006.01)
*C30B 23/00* (2006.01)

(52) U.S. Cl.
CPC ............ *C30B 23/002* (2013.01); *C30B 29/36* (2013.01)

(58) Field of Classification Search
CPC ....... C30B 23/002; C30B 29/26; C30B 25/10; C30B 25/14; C30B 25/16
See application file for complete search history.

(56) References Cited

U.S. PATENT DOCUMENTS

| | | | |
|---|---|---|---|
| 5,076,860 | A | 12/1991 | Ohba et al. |
| 6,254,677 | B1 | 7/2001 | Hashio et al. |
| 2001/0008115 | A1 | 7/2001 | Kawase et al. |
| 2003/0145782 | A1 | 8/2003 | Kawase et al. |
| 2003/0200913 | A1 | 10/2003 | Kawase et al. |
| 2011/0200833 | A1 | 8/2011 | Kamei et al. |
| 2011/0297893 | A1 | 12/2011 | Seki et al. |
| 2015/0299896 | A1 | 10/2015 | Shirai |
| 2016/0138186 | A1 | 5/2016 | Hori et al. |

(Continued)

FOREIGN PATENT DOCUMENTS

| | | | |
|---|---|---|---|
| JP | H06206324 | * | 7/1994 |
| JP | H07-118854 | A | 5/1995 |
| JP | 2001-253790 | A | 9/2001 |

(Continued)

*Primary Examiner* — Robert M Kunemund
(74) *Attorney, Agent, or Firm* — Posz Law Group, PLC

(57) ABSTRACT

A silicon carbide single crystal includes a region in which a change of a specific resistance is repeated in a growth direction of the silicon carbide single crystal, and the change of the specific resistance is a gradual increase and decrease of the specific resistance. A changing range of the specific resistance may be within a range from 0.5% to 50% inclusive. A changing period of the gradual increase and decrease of the specific resistance that is repeated may be 500 μm or less in terms of a length of the silicon carbide single crystal.

9 Claims, 5 Drawing Sheets

(56) References Cited

U.S. PATENT DOCUMENTS

| | | | |
|---|---|---|---|
| 2016/0254148 | A1 | 9/2016 | Kitamura |

FOREIGN PATENT DOCUMENTS

| | | | | | |
|---|---|---|---|---|---|
| JP | 2004-043211 | A | | 2/2004 | |
| JP | 2005075720 | A | * | 3/2005 | |
| JP | 3767719 | B2 | * | 4/2006 | |
| JP | 2006-117512 | A | | 5/2006 | |
| JP | 2006-120785 | A | | 5/2006 | |
| JP | 2007-119273 | A | | 5/2007 | |
| JP | 2008-214146 | A | | 9/2008 | |
| JP | 2010-126380 | A | | 6/2010 | |
| JP | 2010150133 | A | * | 7/2010 | ............. C30B 23/00 |
| JP | 6050053 | B2 | | 12/2016 | |
| JP | 2017-119603 | A | | 7/2017 | |
| JP | 2019-131440 | A | | 8/2019 | |
| JP | 6678437 | B2 | | 4/2020 | |

* cited by examiner 11
1
11a
9a
8a
7a
6
DISCHARGE
7
8
9
10
2
3
13
20
21
22
12
4b
CARRIER GAS SOURCE
5b
4a
4c
DOPANT GAS SOURCE
5c
4
RAW MATERIAL GAS SOURCE
5a
5

SILICON CARBIDE SINGLE CRYSTAL AND MANUFACTURING METHOD OF SILICON CARBIDE SINGLE CRYSTAL

CROSS REFERENCE TO RELATED APPLICATION

The present application claims the benefit of priority from Japanese Patent Application No. 2023-062933 filed on Apr. 7, 2023. The entire disclosure of the above application is incorporated herein by reference.

TECHNICAL FIELD

The present disclosure relates to a silicon carbide (hereinafter referred to as SiC) single crystal and a manufacturing method of a silicon carbide single crystal.

BACKGROUND

Conventionally, there has been known a gas growth method in which a SiC raw material gas is supplied to a growth surface of a seed crystal composed of a SiC single crystal to grow a SiC single crystal on the seed crystal. In the gas growth method, the SiC single crystal is manufactured by introducing $H_2$ (hydrogen) gas serving as a carrier gas and $N_2$ (nitrogen) gas serving as a dopant for adjusting the specific resistance of the SiC single crystal in addition to the SiC raw material gas.

SUMMARY

A SiC single crystal according to a first aspect of the present disclosure includes a region in which a change of a specific resistance is repeated in a growth direction of the SiC single crystal, and the change of the specific resistance is a gradual increase and decrease of the specific resistance.

A manufacturing method of a SiC single crystal according to a second aspect of the present disclosure includes disposing a pedestal in a crucible having a hollow portion constituting a reaction chamber, disposing a seed crystal for growing the SiC single crystal on a surface of the pedestal, and growing the SiC single crystal on a surface of the seed crystal by supplying a raw material gas of SiC, a carrier gas, and a dopant gas containing a dopant from below the pedestal, heating and decomposing the raw material gas, and supplying the raw material gas that is decomposed to the seed crystal. The growing the SiC single crystal is performed so that a change of a specific resistance is repeated with respect to a growth direction of the SiC single crystal, and the change of the specific resistance is a gradual increase and decrease of the specific resistance.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
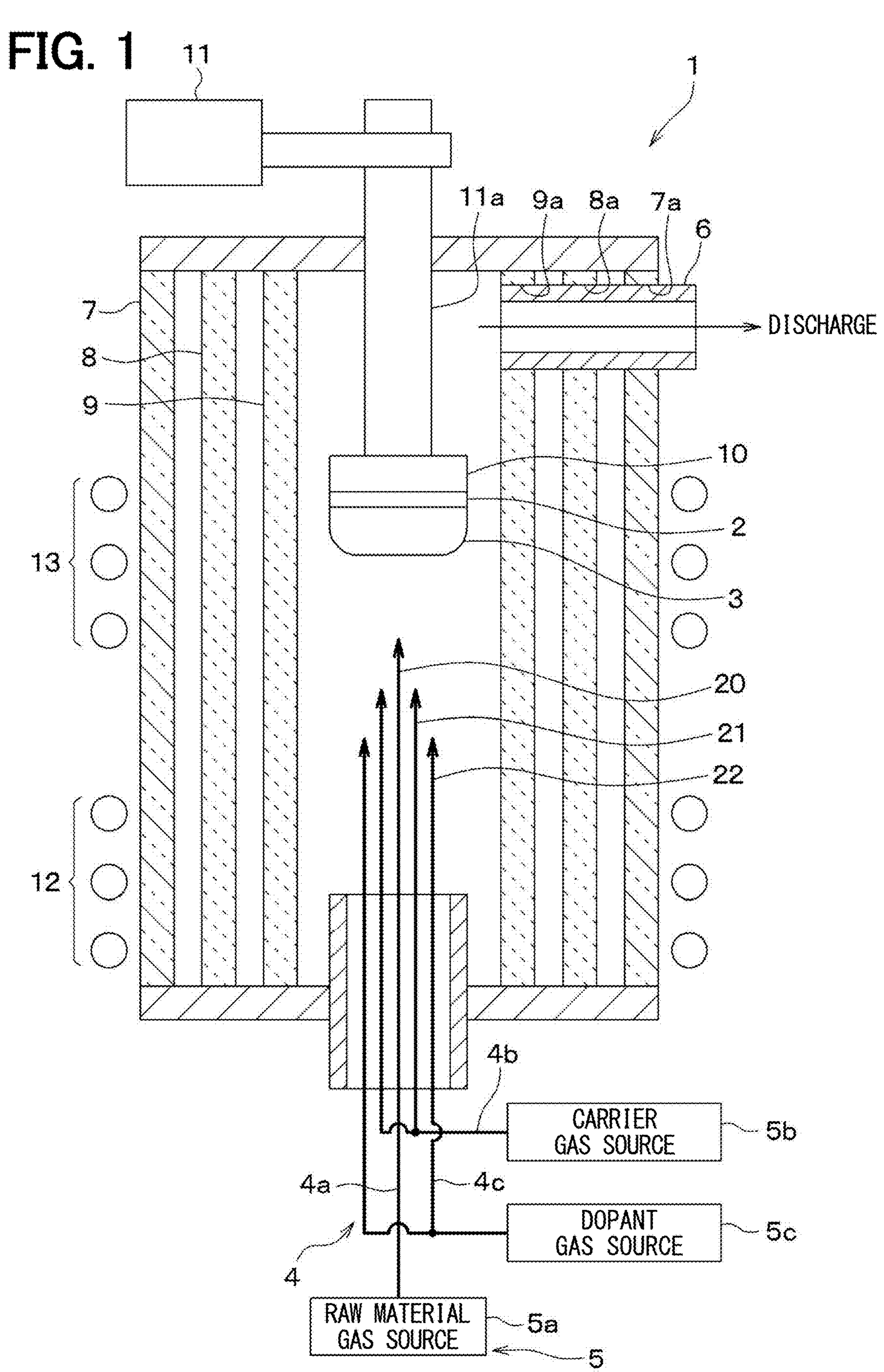
FIG. 1 is a cross-sectional view of a SiC single crystal manufacturing apparatus according to a first embodiment.

Next, a relevant technology is described only for understanding the following embodiments. In order to reduce a cost of manufacturing a SiC single crystal, it is effective to increase a growth rate of the SiC single crystal. However, if the growth rate is too high, polycrystalline grains called differently-oriented crystals may be generated in the SiC single crystal, and the differently-oriented crystals may expand with growth of the SiC single crystal.

When a SiC single crystal ingot is obtained by growing the SiC single crystal, the ingot is sliced and processed into wafers, and the wafers are subjected to a semiconductor process to manufacture devices. However, devices formed in regions where differently-oriented crystals are present are defective products. Therefore, even if high-speed growth is performed for the purpose of reducing the cost, the product yield is deteriorated and the cost is increased.

As a method of removing the differently-oriented crystals, it is conceivable to monitor the SiC single crystal during growth and, when a differently-oriented crystal is generated, feed an etching gas into a furnace to etch the entire SiC single crystal until the differently-oriented crystal disappears. Accordingly, it is possible to restrict the generation of the differently-oriented crystals and to restrict the deterioration of the product yield.

However, in the above-described method, since the SiC single crystal is etched in the middle of growth, loss occurs in the growth of the SiC single crystal by the amount of etching, the substantial growth rate decreases, and the manufacturing cost increases.

A SiC single crystal according to a first aspect of the present disclosure includes a region in which a change of a specific resistance is repeated in a growth direction of the SiC single crystal, and the change of the specific resistance is a gradual increase and decrease of the specific resistance.

As described above, the SiC single crystal includes the region in which the specific resistance is gradually and repeatedly increased and decreased. In the SiC single crystal described above, even if differently-oriented crystals are generated, the differently-oriented crystals are not inherited during growth, and expansion is restricted. Therefore, the SiC single crystal described above can be a SiC single crystal in which differently-oriented crystals are restricted.

A manufacturing method of a SiC single crystal according to a second aspect of the present disclosure includes disposing a pedestal in a crucible having a hollow portion constituting a reaction chamber, disposing a seed crystal for growing the SiC single crystal on a surface of the pedestal, and growing the SiC single crystal on a surface of the seed crystal by supplying a raw material gas of SiC, a carrier gas, and a dopant gas containing a dopant from below the pedestal, heating and decomposing the raw material gas, and supplying the raw material gas that is decomposed to the seed crystal. The growing the SiC single crystal is performed so that a change of a specific resistance is repeated with respect to a growth direction of the SiC single crystal, and the change of the specific resistance is a gradual increase and decrease of the specific resistance.

In this way, by simply repeating the gradual increase and decrease of the specific resistance during the growth of the SiC single crystal, it is possible to eliminate differently-oriented crystals without performing etching, and it is also possible to restrict a decrease in the substantial growth rate of the SiC single crystal. Therefore, the above-described manufacturing method of the SiC single crystal is capable of restricting a decrease in growth rate while restricting differently-oriented crystals.

Hereinafter, embodiments of the present disclosure will be described with reference to the drawings. In the embodiments described hereinafter, the same or equivalent parts will be designated with the same reference numerals.

First Embodiment

A SiC single crystal manufacturing apparatus 1 shown in FIG. 1 is used to manufacture a SiC single crystal ingot by long growth. The present disclosure provides a manufacturing method of a SiC single crystal capable of increasing a growth rate while restricting the generation of differently-oriented crystals using the SiC single crystal manufacturing apparatus 1.

The SiC single crystal manufacturing apparatus 1 is installed such that the vertical direction of FIG. 1 is oriented in the vertical direction. The SiC single crystal manufacturing apparatus 1 supplies a SiC raw material gas to a surface of a seed crystal 2 composed of a SiC single crystal substrate to grow a SiC single crystal 3 on the surface of the seed crystal 2. Specifically, the SiC single crystal manufacturing apparatus 1 includes a gas supply portion 4, a gas introduction source 5, a gas discharge port 6, a vacuum container 7, a heat insulating member 8, a heating container 9, a pedestal 10, a rotary pulling mechanism 11, and first and second heating devices 12 and 13.

The gas supply portion 4 is provided at a position below the SiC single crystal manufacturing apparatus 1. The gas supply portion 4 introduces a raw material gas 20 including various gases serving as SiC raw materials, a carrier gas 21, and a dopant gas 22 from the gas introduction source 5 into the SiC single crystal manufacturing apparatus 1.

The gas supply portion 4 includes a raw material gas supply portion 4*a* for supplying the raw material gas 20, a carrier gas supply portion 4*b* for supplying the carrier gas 21, and a dopant gas supply portion 4*c* for supplying the dopant gas 22. Although not shown in the drawings, each of the gas supply portions 4*a* to 4*c* is constituted by components constituting supply paths. The raw material gas supply portion 4*a* introduces the raw material gas 20 from a material gas source 5*a* to be described later into the SiC single crystal manufacturing apparatus 1. The carrier gas supply portion 4*b* introduces the carrier gas 21 from a carrier gas source 5*b* to be described later into the SiC single crystal manufacturing apparatus 1. The dopant gas supply portion 4*c* introduces the dopant gas 22 from a dopant gas source 5*c* to be described later into the SiC single crystal manufacturing apparatus 1.

The gas introduction source 5 supplies a gas containing the SiC raw material gas into the SiC single crystal manufacturing apparatus 1. In the present embodiment, the gas introduction source 5 includes the raw material gas source 5*a*, the carrier gas source 5*b*, and the dopant gas source 5*c*.

The raw material gas source 5*a* supplies the SiC raw material gas containing Si and C, for example, the raw material gas 20 containing a mixed gas of a silane-based gas such as silane and a hydrocarbon-based gas such as propane. The carrier gas source 5*b* supplies the carrier gas 21 such as $H_2$. The dopant gas source 5*c* supplies the dopant gas 22 such as $N_2$. Although not shown, each of the gas sources 5*a* to 5*c* includes a heating device for controlling the temperature of each supply gas, a flow rate control device for controlling the flow rate, and the like, and the temperature and the flow rate of each supply gas can be controlled according to a growth state of the SiC single crystal 3.

The gas discharge port 6 discharges unreacted gas in the raw material gas 20 after being supplied to the seed crystal 2, the carrier gas 21, the dopant gas 22, and the like to the outside of the SiC single crystal manufacturing apparatus 1 as exhaust gas.

The vacuum container 7 is made of quartz glass or the like and has a tubular shape having a hollow portion. In the present embodiment, the vacuum container 7 has a cylindrical shape. The vacuum container 7 has such a structure that the raw material gas 20, the carrier gas 21, and the dopant gas 22 can be introduced and discharged. The vacuum container 7 accommodates other components of the SiC single crystal manufacturing apparatus 1, and is configured to be able to reduce a pressure by vacuum drawing in an accommodated internal space. As described above, the raw material gas supply portion 4*a* for supplying the raw material gas 20, the carrier gas supply portion 4*b* for supplying the carrier gas 21, and the dopant gas supply portion 4*c* for supplying the dopant gas 22 are provided at the bottom of the vacuum container 7. Furthermore, a through hole 7*a* is provided in an upper portion of the vacuum container 7, specifically, at an upper position of a side wall, and the gas discharge port 6 for discharging the exhaust gas such as the unreacted gas in the raw material gas 20 is fitted into the through hole 7*a*.

The heat insulating member 8 has a tube shape providing a hollow portion, in the present embodiment, a cylindrical shape, and is disposed coaxially with the vacuum container 7. The heat insulating member 8 has the cylindrical shape having a diameter smaller than a diameter of the vacuum container 7, and is disposed inside the vacuum container 7, thereby inhibiting a heat transfer from a space inside the heat insulating member 8 to the vacuum container 7. The heat insulating member 8 is made of, for example, graphite. A surface of the heat insulating member 8 may be coated with a high-melting point metal carbide such as tantalum carbide (TaC) or niobium carbide (NbC) so as to be less likely to be thermally etched. A through hole 8*a* is provided in an upper portion of the heat insulating member 8, specifically, in an upper position of a side wall, and the gas discharge port 6 is fitted into the through hole 8*a*.

The heating container 9 configures a crucible serving as a reaction container, and has a tube shape providing a hollow portion, in the present embodiment, a cylindrical shape. The hollow portion of the heating container 9 forms a reaction chamber in which the SiC single crystal 3 is grown on the surface of the seed crystal 2. The heating container 9 is made of, for example, graphite. A surface of the heating container 9 may be coated with a high-melting point metal carbide such as TaC or NbC so as to be less likely to be thermally etched. The heating container 9 is disposed so as to surround the pedestal 10. The exhaust gas such as the unreacted gas in the raw material gas 20 is guided to the gas discharge port 6 through a space between an inner peripheral surface of the heating container 9 and outer peripheral surfaces of the seed crystal 2 and the pedestal 10. The SiC raw material gas in the raw material gas 20 is decomposed in the heating container 9 before the raw material gas 20 from the raw material gas supply portion 4*a* is introduced to the seed crystal 2. A through hole 9*a* is provided in an upper portion of the heating container 9, specifically, in an upper position of a side wall, and the gas discharge port 6 is fitted into the through hole 9*a*.

The pedestal 10 is a member on which the seed crystal 2 is disposed. The pedestal 10 has, for example, a circular surface on which the seed crystal 2 having a disk shape is placed, and the central axis of the pedestal 10 is disposed coaxially with the central axis of the heating container 9 and the central axis of a shaft 11*a* of the rotary pulling mechanism 11 described later. The pedestal 10 is made of, for example, graphite. A surface of the pedestal 10 may be coated with a high-melting point metal carbide such as TaC or NbC to be less likely to be thermally etched. The seed crystal 2 is attached to one surface of the pedestal 10 facing the raw material gas supply portion 4*a*, and the SiC single crystal 3 is grown on the surface of the seed crystal 2. The pedestal 10 is connected to the shaft 11*a* in a surface opposite to the surface on which the seed crystal 2 is disposed. The pedestal 10 is rotated with the rotation of the shaft 11*a*, and can be pulled upward while the shaft 11*a* is pulled up.

The rotary pulling mechanism 11 rotates and pulls up the pedestal 10 through the shaft 11*a* formed of a pipe member or the like. In the present embodiment, the shaft 11*a* is formed in a straight line extending up and down. One end of the shaft 11*a* is connected to the surface of the pedestal 10 opposite to the surface on which the seed crystal 2 is attached, and the other end of the shaft 11*a* is connected to a main body of the rotary pulling mechanism 11. The shaft 11*a* is also made of, for example, graphite. A surface of the shaft 11*a* may be coated with a high-melting point metal carbide such as TaC or NbC to be less likely to be thermally etched. With the above configuration, the pedestal 10, the seed crystal 2, and the SiC single crystal 3 can be rotated and pulled up, so that a growth plane of the SiC single crystal 3 can have a desired temperature distribution, and a temperature of the growth surface can be adjusted to a temperature suitable for growth along with the growth of the SiC single crystal 3.

The first and second heating devices 12 and 13 are formed of a heating coil such as an induction heating coil or a direct heating coil, and are disposed so as to surround a periphery of the vacuum container 7. In the case of the present embodiment, the first and second heating devices 12 and 13 are configured by induction heating coils. The first heating device 12 and the second heating device 13 are configured to be capable of independently controlling the temperature of a target location. The first heating device 12 is disposed at a position corresponding to a lower position of the heating container 9, and the second heating device 13 is disposed at a position corresponding to the pedestal 10. Therefore, the temperature of the lower portion of the heating container 9 can be controlled by the first heating device 12 to heat and decompose the SiC raw material gas. In addition, the temperature around the pedestal 10, the seed crystal 2, and the SiC single crystal 3 can be controlled to a temperature suitable for the growth of the SiC single crystal 3 by the second heating device 13.

The SiC single crystal manufacturing apparatus 1 is configured as described above. Subsequently, a manufacturing method of the SiC single crystal 3 using the SiC single crystal manufacturing apparatus 1 according to the present embodiment will be described.

First, the seed crystal 2 is attached to the one surface of the pedestal 10. The seed crystal 2 is, for example, an off substrate in which the growth surface of the SiC single crystal 3, that is, one surface opposite to the pedestal 10 has a predetermined off-angle, such as 4° or 8°, with respect to a (0001) C-plane. Subsequently, the pedestal 10 and the seed crystal 2 are disposed in the heating container 9. Then, the first heating device 12 and the second heating device 13 are controlled to provide a desired temperature distribution. In other words, the temperature distribution is controlled such that the SiC raw material gas contained in the raw material gas 20 is heated and decomposed to be supplied to the surface of the seed crystal 2, and the SiC raw material gas is recrystallized on the surface of the seed crystal 2, while a sublimation rate is higher than a recrystallization rate in the heating container 9. Accordingly, the temperature of the bottom portion of the heating container 9 can be set to a high temperature of 2000° C. or higher, for example, 2400° C., and the temperature of the surface of the seed crystal 2 can be set to a temperature lower than that of the bottom portion of the heating container 9 and suitable for recrystallization of the SiC single crystal 3, for example, about 2200° C.

In addition, the raw material gas 20 containing the SiC raw material gas is introduced through the raw material gas supply portion 4*a* while the vacuum container 7 is set to a desired pressure. As a result, the raw material gas 20 is supplied to the seed crystal 2 as shown by the arrows in FIG. 1, and the SiC single crystal 3 is grown on the surface of the seed crystal 2 based on the gas supply. Furthermore, the carrier gas 21 is introduced through the carrier gas supply portion 4*b*, and the dopant gas 22 is introduced through the dopant gas supply portion 4*c*. As a result, the carrier gas 21 and the dopant gas 22 are supplied inside the heating container 9, and the SiC single crystal 3 is doped with N contained in the dopant gas 22.

Then, the rotary pulling mechanism 11 pulls up the pedestal 10, the seed crystals 2 and the SiC single crystal 3 in accordance with the growth rate of the SiC single crystal 3 while rotating them through the shaft 11*a*. As a result, a height of the growth surface of the SiC single crystal 3 is kept substantially constant, and the temperature distribution of the growth surface temperature can be controlled with high controllability.

Figure 2:
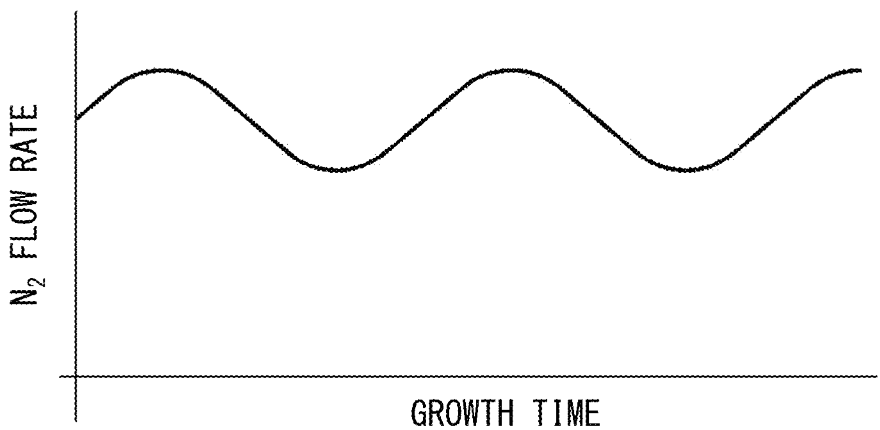
FIG. 2 is a diagram showing the change in a flow rate of $N_2$, which is a dopant gas, with respect to a growth time.

When the SiC single crystal 3 is grown, the flow rate of the dopant gas 22 is periodically and repeatedly changed as shown in FIG. 2 so that the content of $N_2$ in the SiC single crystal manufacturing apparatus 1 is changed and the specific resistance of the SiC single crystal 3 is periodically changed. Specifically, the flow rate of the dopant gas 22 introduced from the dopant gas supply portion 4*c* into the heating container 9 is periodically increased and decreased by adjusting the flow rate at the dopant gas source 5*c*. In the present embodiment, the flow rate of the dopant gas 22 is periodically increased and decreased in a sine wave shape.

According to experiments by the inventors, it was confirmed that when the specific resistance of the SiC single crystal 3 is periodically changed, the differently-oriented crystals disappear at a minute size stage during growth, that is, the differently-oriented crystals are not inherited by the grown crystal. When the specific resistance is periodically changed, the amount of N introduced as the dopant is gradually changed in the process in which the specific resistance is gradually increased and gradually decreased, and differently-oriented crystals can be eliminated at the minute size stage during the change.

Figure 3:
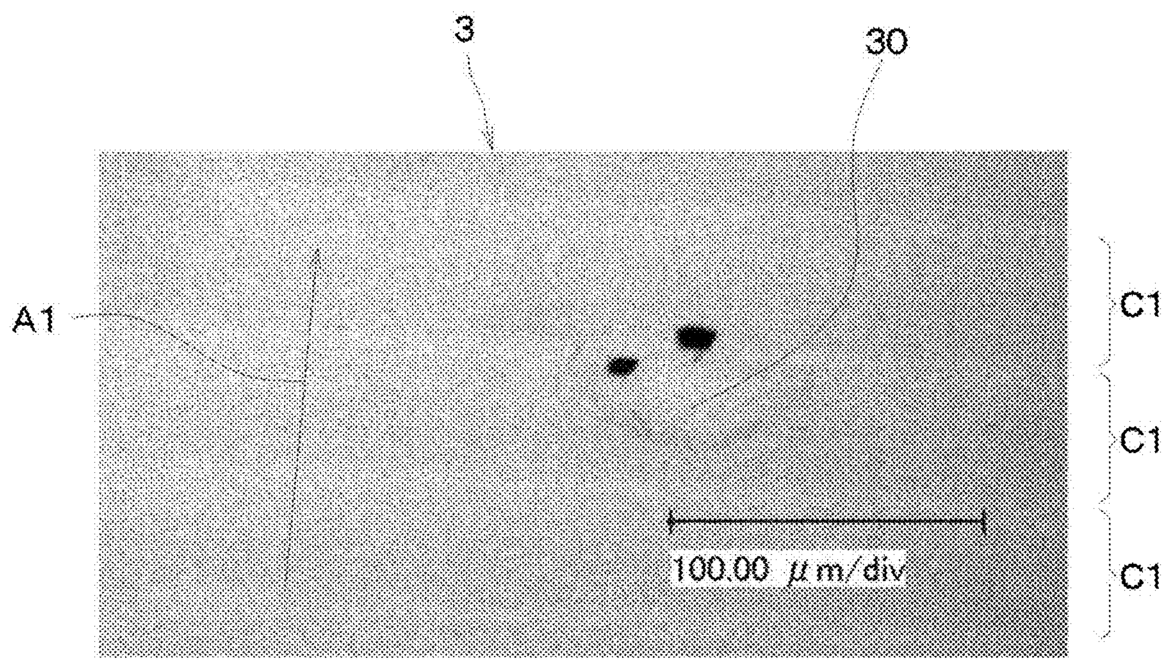
FIG. 3 is a binarized diagram of a microscopic image in a case where the specific resistance is repeatedly increased and decreased by changing the flow rate of the dopant gas as shown in FIG. 2.

FIG. 3 shows this situation. In the SiC single crystal 3, the color changes according to the specific resistance. The color becomes light at a position where the specific resistance is high, and the color becomes dark at a position where the specific resistance is low. As shown in FIG. 3, the color gradually changes from a light color to a dark color and from a dark color to a light color for each changing period C1 along a growth direction A1 of the SiC single crystal 3. It can be seen that a differently-oriented crystal 30 is generated in the middle of the growth of the SiC single crystal 3, but even if the SiC single crystal 3 grows in the process of color change, the differently-oriented crystal 30 is no longer inherited and disappears from the subsequently grown crystal.

Figure 4:
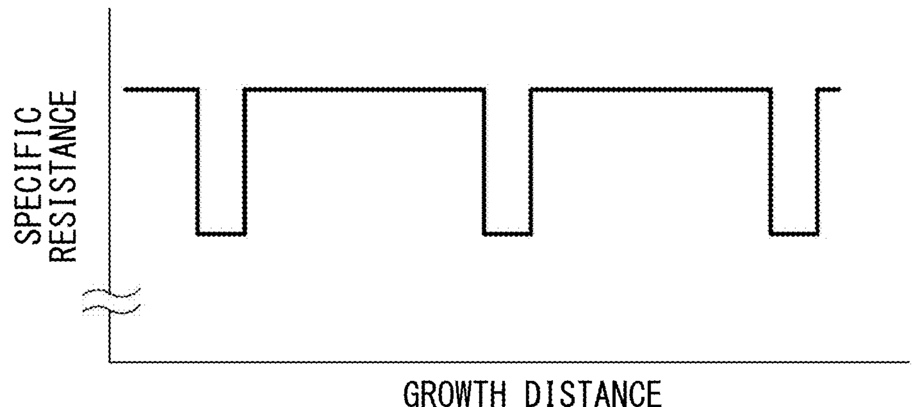
FIG. 4 is a diagram showing a case where the specific resistance is changed in a pulse shape with respect to a growth distance, which is described as a comparative example.

As a result of various verifications by the inventors, it was confirmed that the above-described phenomenon occurred when the specific resistance was repeatedly and gradually increased and decreased, and did not occur in a process in which the specific resistance was not gradually increased and decreased. For example, conventionally, there is a marking doping technique in which the amount of introduction of $N_2$ as a dopant is changed in a pulsed manner to change the specific resistance in a pulsed manner during growth as shown in FIG. 4 for inspection. However, even if the introduction amount of $N_2$ is changed in the pulsed manner as described above, the differently-oriented crystal 30 cannot be eliminated. It is considered that this is because, even if the specific resistance is simply changed in the pulsed manner, the differently-oriented crystal 30 is generated in both a case where the specific resistance is high and a case where the specific resistance is low, and in both cases, the differently-oriented crystal 30 is expanded when the specific resistance is not changed. Therefore, it can be said that it is necessary to repeatedly and gradually increase and decrease the specific resistance in order to eliminate the differently-oriented crystal 30. There may be a portion grown without temporarily changing the specific resistance, and the growth amount of the portion may be set to an allowable level even if the differently-oriented crystal 30 is generated and expanded in the portion.

In order to obtain the effect of eliminating the differently-oriented crystal 30, a certain degree of changing range of the specific resistance is sufficient, and for example, the changing range, that is, the ratio of the change to the median value of the specific resistance is preferably 0.5% or more. In addition, when the change range of the specific resistance is too large, defects such as different polytypes and dislocations are generated. Therefore, the change range of the specific resistance is preferably 50% or less.

Furthermore, the relationship between the changing period of the specific resistance and the effect of eliminating the differently oriented crystals 30 was examined, and it was confirmed that when the changing period of the specific resistance is too large, the size of generated polycrystals increases, and the polycrystals may not be eliminated. It was found that such a phenomenon occurs when the changing period of the specific resistance is greater than 500 μm in terms of the length of the SiC single crystal 3. When the changing period of the specific resistance is converted into the length of the SiC single crystal 3, the changing period is represented by period time×growth rate=changing period, and the value obtained by multiplying the time for one period indicated by the growth time in FIG. 2 by the growth rate of the SiC single crystal 3 at that time is the changing period.

A thickness of each wafer cut out from the SiC single crystal ingot is about 300 μm or 500 μm. If the changing period of the specific resistance is too large, the specific resistance of the wafer varies due to the influence of the changing period of the specific resistance. That is, in a state where the change of the specific resistance is repeated a plurality of times in the thickness of the wafer, the specific resistance of each wafer is averaged even if the wafer is cut out at any position of the SiC single crystal ingot. However, when the changing period of the specific resistance is large, the specific resistance of the wafer varies depending on the position of the SiC single crystal ingot at which the wafer is cut out, and the characteristics of the finally manufactured device also vary.

In consideration of these facts, it is preferable that the changing period of the specific resistance is 500 μm or less in terms of the length of the SiC single crystal 3. Furthermore, in consideration of variation in the specific resistance in cases of wafers, it is preferable that the changing range of the specific resistance is within a range from 0.5% to 10% inclusive, and the changing period of the specific resistance is 100 μm or less in terms of the length of the SiC single crystal 3.

It should be noted that the periodic change of the specific resistance does not necessarily require the presence of the entire region of SiC single crystal ingots to be effective. If the periodic change of the specific resistance is present in any region, it is possible to restrict the differently-oriented crystals 30 in that region, and it is possible to expand the effective region at the time of device fabrication. In particular, it is effective to provide the periodic change of the specific resistance to a crystal region or a facet region formed under the high-speed growth condition in which the differently-oriented crystal 30 is easily generated. For example, when the flow rate of the dopant gas 23 is varied while the raw material gas 20, the carrier gas 21, and the dopant gas 23 are intensively supplied to the facet region, the periodic change of the specific resistance is provided in the facet region.

As described above, the specific resistance of the SiC single crystal 3 of the present embodiment is periodically and gradually increased and decreased. In the SiC single crystal 3 described above, even if the differently-oriented crystals 30 are generated, the differently-oriented crystals 30 are not inherited during growth, and expansion of the differently-oriented crystals 30 is restricted. Therefore, the differently-oriented crystals 30 can be restricted in the SiC single crystal 3.

In addition, by manufacturing the SiC single crystal 3 while periodically and gradually increasing and decreasing the specific resistance, even if the differently-oriented crystals 30 are generated during the growth of the SiC single crystal 3, the differently-oriented crystals 30 can be restricted from expanding and can be eliminated during the growth. In addition, it is not necessary to perform etching for removing the differently-oriented crystals 30.

In a case where the SiC single crystal 3 is manufactured without changing the specific resistance or with changing the specific resistance in a pulsed manner, when the differently-oriented crystals 30 are generated, the differently-oriented crystals 30 are expanded along with the growth. Therefore, when a SiC single crystal ingot obtained by growing the SiC single crystal 3 is cut out and processed into wafers, and the wafers are subjected to a semiconductor process to produce devices, devices including the differently-oriented crystals 30 are defective products. When a range in which the differently-oriented crystals 30 are present increases, the number of devices that become defective products increases, and the product yield decreases. On the other hand, when the differently-oriented crystals 30 are generated, it is possible to remove the differently-oriented crystals 30 by etching the SiC single crystal 3. However, it is necessary to monitor the generation of differently-oriented crystals 30, and to remove the differently-oriented crystals 30. As a result, a loss occurs in the growth of the SiC single crystal 3, the actual growth rate decreases, and the product cost increases.

On the other hand, according to the present embodiment, it is possible to eliminate the differently-oriented crystals 30 without performing etching and to restrict the decrease in the substantial growth rate of the SiC single crystal 3 only by periodically and gradually increasing and decreasing the specific resistance during the growth of the SiC single crystal 3. This also improves the product yield and reduces the manufacturing cost.

OTHER EMBODIMENTS

While the present disclosure has been described in accordance with the embodiments described above, the present disclosure is not limited to the embodiments and includes various modifications and equivalent modifications. In addition, various combinations and configurations, as well as other combinations and configurations that include only one element, more, or less, fall within the scope and spirit of the present disclosure.

For example, in the first embodiment, the specific resistance of the SiC single crystal 3 is gradually increased and decreased by periodically and repeatedly changing the flow rate of the dopant gas 22. However, the specific resistance of the SiC single crystal 3 may be gradually increased and decreased by a method other than the flow rate adjustment of the dopant gas 22.

Figure 5:
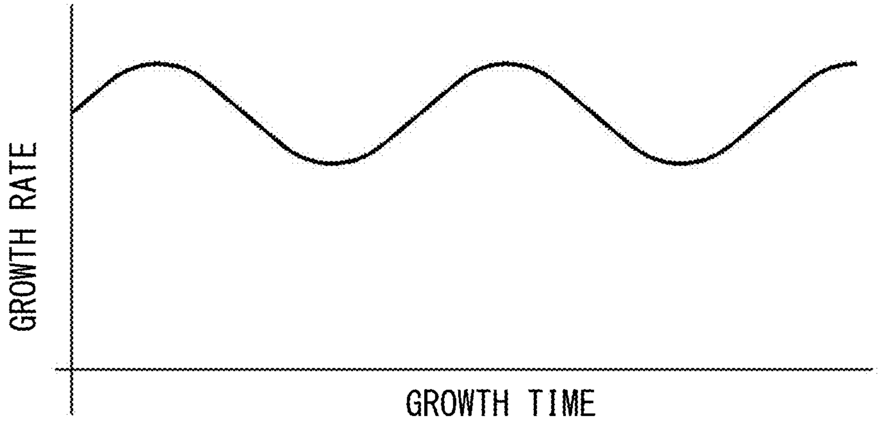
FIG. 5 is a diagram showing the change in a growth rate with respect to a growth time, which is described in another embodiment.

For example, as shown in FIG. 5, when the growth rate is gradually increased and decreased with respect to the growth time, the amount of dopant introduced into the SiC single crystal 3 is changed, and the specific resistance of the SiC single crystal 3 can be periodically changed. For example, under the condition that the flow rate of the dopant gas 22 is constant, the growth rate of the SiC single crystal 3 can be increased by increasing the flow rate of the raw material gas 20, increasing the partial pressure of the raw material gas 20, decreasing the surface temperature of the SiC single crystal 3, or the like. Therefore, by adjusting one or more of the flow rate of the raw material gas 20, the partial pressure of the raw material gas 20, the surface temperature of the SiC single crystal 3, and the like, the growth rate of the SiC single crystal 3 can be periodically and gradually increased and decreased, and the specific resistance of the SiC single crystal 3 can be periodically changed.

Figure 6:
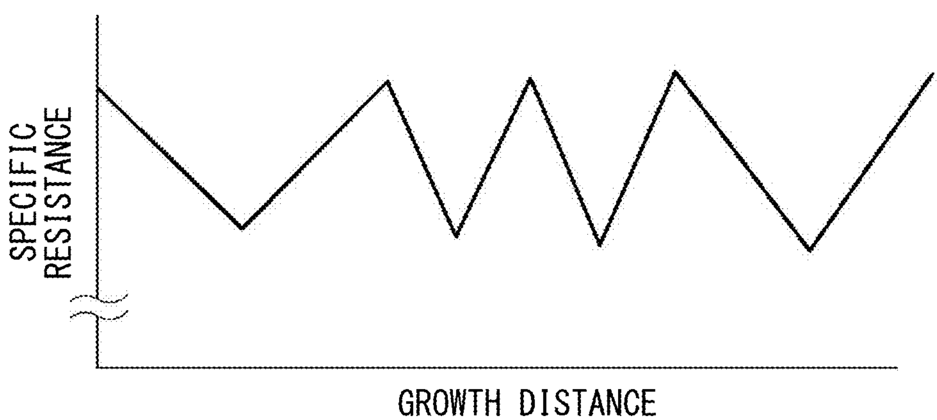
FIG. 6 is a diagram showing a case where the specific resistance is repeatedly and gradually increased and decreased with respect to the growth distance, which is described in another embodiment.

In the above description, the specific resistance of the SiC single crystal 3 is periodically changed. However, it is not necessary to change the specific resistance at a constant period. For example, as shown in FIG. 6, if the change of the specific resistance in which the specific resistance is gradually increased and decreased with respect to the growth distance of the SiC single crystal 3 is repeated, the specific resistance may change irregularly. Even in this case, the changing period of each repeated increase and decrease may be 500 μm or less in terms of the length of the SiC single crystal 3.

In the first embodiment, the SiC single crystal manufacturing apparatus 1 has been described as an example of an up-flow method in which the raw material gas 20 is supplied to the growth surface of the SiC single crystal 3 and then passed through the outer peripheral surface of the SiC single crystal 3 or the side of the pedestal 10 to be further discharged upward. However, the present disclosure is not limited to the above configuration, but a return flow system may be applied in which after the raw material gas 20 is supplied to the growth surface of the SiC single crystal 3, the raw material gas 20 is returned in the same direction as the supply direction again. In addition, a side-flow method may be employed in which the raw material gas 20 is supplied to the growth surface of the SiC single crystal 3 and then discharged toward the outer periphery of the heating container 9.

What is claimed is:

1. A silicon carbide single crystal comprising a region in which a change of a specific resistance is repeated in a growth direction of the silicon carbide single crystal, wherein the change of the specific resistance is a gradual increase and decrease of the specific resistance, and a changing period of the gradual increase and decrease of the specific resistance that is repeated is 500 μm or less in terms of a length of the silicon carbide single crystal.

2. The silicon carbide single crystal according to claim 1, wherein a changing range of the specific resistance is within a range from 0.5% to 50% inclusive.

3. The silicon carbide single crystal according to claim 1, wherein a changing range of the specific resistance is within a range from 0.5% to 10% inclusive, and the changing period of the gradual increase and decrease of the specific resistance that is repeated is 100 μm or less in terms of the length of the silicon carbide single crystal.

4. The silicon carbide single crystal according to claim 1, wherein the change of the specific resistance is repeated in a facet region.

5. A manufacturing method of a silicon carbide single crystal, comprising:

disposing a pedestal in a crucible having a hollow portion constituting a reaction chamber, and disposing a seed crystal for growing the silicon carbide single crystal on a surface of the pedestal; and growing the silicon carbide single crystal on a surface of the seed crystal by supplying a raw material gas of silicon carbide, a carrier gas, and a dopant gas containing a dopant from below the pedestal, heating and decomposing the raw material gas, and supplying the raw material gas that is decomposed to the seed crystal, wherein the growing the silicon carbide single crystal is performed so that a change of a specific resistance is repeated with respect to a growth direction of the silicon carbide single crystal, the change of the specific resistance is a gradual increase and decrease of the specific resistance, and a changing period of the gradual increase and decrease of the specific resistance that is repeated is 500 μm or less in terms of a length of the silicon carbide single crystal.

6. The manufacturing method according to claim 5, wherein the growing the silicon carbide single crystal includes periodically changing a flow rate of the dopant gas so that the change of the specific resistance is repeated with respect to the growth direction of the silicon carbide single crystal.

7. The manufacturing method according to claim 5, wherein the growing the silicon carbide single crystal includes changing one or more of a flow rate of the raw material gas, a partial pressure of the raw material gas, and a temperature of a growth surface of the silicon carbide single crystal so that the change of the specific resistance is repeated with respect to the growth direction of the silicon carbide single crystal.

8. The silicon carbide single crystal according to claim 1, wherein the changing period is 100 μm or less in terms of the length of the silicon carbide single crystal.

9. The manufacturing method according to claim 5, wherein the changing period is 100 μm or less in terms of the length of the silicon carbide single crystal.

* * * * *